United States Patent
Kim et al.

(10) Patent No.: US 6,876,709 B1
(45) Date of Patent: Apr. 5, 2005

(54) QUANTIZATION METHOD FOR ITERATIVE DECODER IN COMMUNICATION SYSTEM

(75) Inventors: Min-Goo Kim, Suwon-shi (KR); Beong-Jo Kim, Songnam-shi (KR); Young-Hwan Lee, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/473,361

(22) Filed: Dec. 28, 1999

(30) Foreign Application Priority Data

Dec. 31, 1998 (KR) ........................................ 1998-62715

(51) Int. Cl.[7] .............................. H03D 1/00; H04L 27/06
(52) U.S. Cl. .................. 375/341; 375/240.03; 375/262
(58) Field of Search ................................ 375/341, 340, 375/262, 150, 242; 370/342, 487; 704/222, 229; 382/251; 341/50

(56) References Cited

U.S. PATENT DOCUMENTS

| | | | |
|---|---|---|---|
| 4,379,347 A | | 4/1983 | Girardi et al. |
| 5,241,383 A | | 8/1993 | Chen et al. |
| 5,661,755 A | * | 8/1997 | Van De Kerkhof et al. 375/242 |
| 5,727,029 A | * | 3/1998 | Jeon et al. ................... 375/341 |
| 5,966,401 A | * | 10/1999 | Kumar ......................... 375/150 |
| 5,970,085 A | * | 10/1999 | Yi ................................ 370/342 |
| 6,125,149 A | * | 9/2000 | Jafarkhani et al. .......... 375/262 |
| 6,195,465 B1 | * | 2/2001 | Zandi et al. ................. 382/248 |

FOREIGN PATENT DOCUMENTS

| | | |
|---|---|---|
| EP | 0 300 775 A2 | 1/1991 |
| JP | 04-117821 | 4/1992 |
| JP | 05-207075 | 8/1993 |
| JP | 05-244017 | 9/1993 |
| JP | 06-169262 | 6/1994 |
| JP | 06-244754 | 9/1994 |
| JP | 07-095098 | 4/1995 |
| JP | 09-121172 | 5/1997 |
| JP | 10-084237 | 3/1998 |

OTHER PUBLICATIONS

"Implementation and Performance of a Serial MAP Decoder for Use in An Interative Turbo Deocder", Steven S. Peetrobon, Proc., IEEE Int. Symp. on Information Theory, p. 471, 1995.
Radio Transmission Technology (RTT) TIA–TR45.5, Jun. 2, 1998, pp. 8–11.
Japanese Office Action dated Sep. 17, 2002, Issued in a counterpart application, namely Japanese Appln. No. 2000–592949.
Russian Office Action dated Aug. 13, 2002, issued in a counterpart application, namely Russian Appln. No. 2001117830/09.
I.V. Sintjakovsky et al., Digital Transmission Systems of Subscriber Lines, Moscow, *Radio i. Svias Publishers*, 1987, pp. 32–42 (with translation).

\* cited by examiner

*Primary Examiner*—Stephen Chin
*Assistant Examiner*—Curtis Odom
(74) *Attorney, Agent, or Firm*—Dilworth & Barrese LLP

(57) ABSTRACT

A quantization method for an iterative decoder. In the quantization method, received signal levels are equally divided into predetermined intervals within a range $2^n$ (n is a positive integer) times greater than the transmission signal level range of the transmitter, and the level of the input signal received in each period is quantized.

11 Claims, 5 Drawing Sheets

QUANTIZATION METHOD FOR ITERATIVE DECODER IN COMMUNICATION SYSTEM

PRIORITY

This application claims priority to an application entitled "Quantization Method for Iterative Decoder in Communication System" filed in the Korean Industrial Property Office on Dec. 31, 1998 and assigned Serial No. 98-62715, the contents of which are hereby incorporated by reference.

BACKGROUND OF THE INVENTION

1. Field of the Invention

The present invention relates generally to a receiver in a communication system, and in particular, to a device and method for quantizing a received signal.

2. Description of the Related Art

System resources such as bit number, power, and process delay are limited when a channel decoder is constructed in a real situation. A specific signal must be represented by a limited number of bits, particularly for processing in a decoder. In other words, the analog signal applied to the input of the decoder must be quantized. Signal resolution or signal precision should be considered for quantization because it has a great influence on the performance of the decoder. Accordingly, a quantization method involving accurate selection of the number of quantization bits (QB) is a significant challenge to a system designer when he represents the signals for the input terminal of a decoder and inside the decoder.

A transmitter in a radio communication system (e.g., satellite system, WCDMA, CDMA-2000) can use forward error correction codes for reliable data transmission, and a receiver can apply iterative decoding to received data. The iterative decoding is characterized by feeding decoded output back to the input of a decoder. Therefore, the output of an iterative decoder is not a hard-decision signal like a high or low signal (e.g., +1, −1) but a soft-decision signal (e.g., 0.7684, −0.6432, . . . ). The iterative decoder is constituted out of at least two component decoders and an interleaver which is located between the component decoders and permutes the sequence of bits received from the component decoder at its input end. When decoded signal components are fed back to the output terminal of the iterative decoder, the deinterleaver of the iterative decoder reorders the bits of the interleaved signal in their original positions.

FIG. 1 is a graph illustrating a quantization method in a conventional Viterbi decoder for transmission of a voice signal.

In FIG. 1, the horizontal axis of the graph indicates the amplitude levels of a received signal, and a vertical axis indicates the probability density functions (PDFs) of the two signals. It is assumed herein that a transmission channel for the received signal is an additive white Gaussian noise (AWGN) channel. The received and demodulated signal is quantized at predetermined intervals with respect to the PDF. This quantization is generally utilized due to its advantages of simplicity and good decoding performance. As shown in FIG. 1, QB is 4 bits and the resulting quantization levels (QL) are used to represent the range between +A and −A which are the levels of a signal received from a transmitter. For example, though the received signal may have a value above +A or below −A due to noise on a transmission channel, it is mapped to a maximum quantization level (QMAX) or minimum quantization level (QMIN), respectively.

A Viterbi decoder basically employs a non-iterative decoding scheme and outputs a hard-decision value, which is not re-decoded. Therefore, the Viterbi decoder can decode an input signal with sufficient reliability in the above quantization method. When the QB is set to 4 (QL=16), the performance difference between the Viterbi decoding and infinite level decoding is no more than 0.2 dB.

On the other hand, the input/output of an iterative decoder is based on soft-input/soft-output (SISO). Hence, confidence as well as polarity should be considered in the design of the input of the decoder. That is, the output signal of the SISO iterative decoder that will be fed back should be not a hard-decision signal (high or low) but a soft decision signal. But signals beyond the transmission level range from +A and −A are truncated during analog-to-digital conversion in the conventional quantization method described in FIG. 1, resulting in a serious degradation of the performance of the iterative decoder. Therefore, different levels must be assigned to the signals above +A and below −A, which are applied to the input of the iterative decoder. In order words, the quantization range should be expanded beyond the transmission level range between +A and −A, so that the reliability for an input signal of the iterative decoder is differentiated.

When representation levels of an input signal are allocated as in the conventional quantization method of FIG. 1, the insufficient quantization resolution resulting from expansion of the quantization range is likely to degrade the performance of the iterative decoder. Hence, the optimal QB should be determined.

Especially, though a BPSK (Binary Phase Shift Keying) or QPSK (Quadrature Phase Shift Keying) demodulation signal applied to a turbo decoder in a receiver is generally an analog signal, criteria on which to obtain parameters for quantizing the analog signal should be presented when a turbo decoder is configured in real VLSIs.

SUMMARY OF THE INVENTION

It is, therefore, an object of the present invention to provide a method of expanding the quantization range above the highest value and below the lowest value of a transmission level range, for an iterative decoder in a communication system.

It is another object of the present invention to provide a quantization method for a turbo decoder, for obtaining an optimal quantization range from any number of quantization bits.

It is a third object of the present invention to provide a quantization method for a turbo decoder, for obtaining an optimal quantization range from empirically given quantization bits.

It is a fourth object of the present invention to provide a method of setting the number of bits by which to represent the internal signal of each component decoder, which method is based on the number of quantization bits of an input signal of an iterative decoder and the metric computation of each component decoder when the code rate of the iterative decoder is 1/4 or above.

It is a fifth object of the present invention to provide a method of obtaining an optimal quantization parameter for a turbo decoder in a communication system.

It is a sixth object of the present invention to provide a method of presenting criteria on which to obtain parameters for quantizing an analog signal at the input end of a turbo decoder when the turbo decoder is constituted in real VLSIs.

Briefly, these and other objects are achieved by providing a quantization method for an iterative decoder. In the quantization method, received signal levels are equally divided into predetermined intervals within a range $2^n$ (n is a positive integer) times greater than the transmission signal level range of a transmitter, and the level of a signal received in each period is quantized.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described hereinbelow with reference to the accompanying drawings. In the following description, well-known functions or constructions are not described in detail since they would obscure the invention in unnecessary detail.

Figure 2:
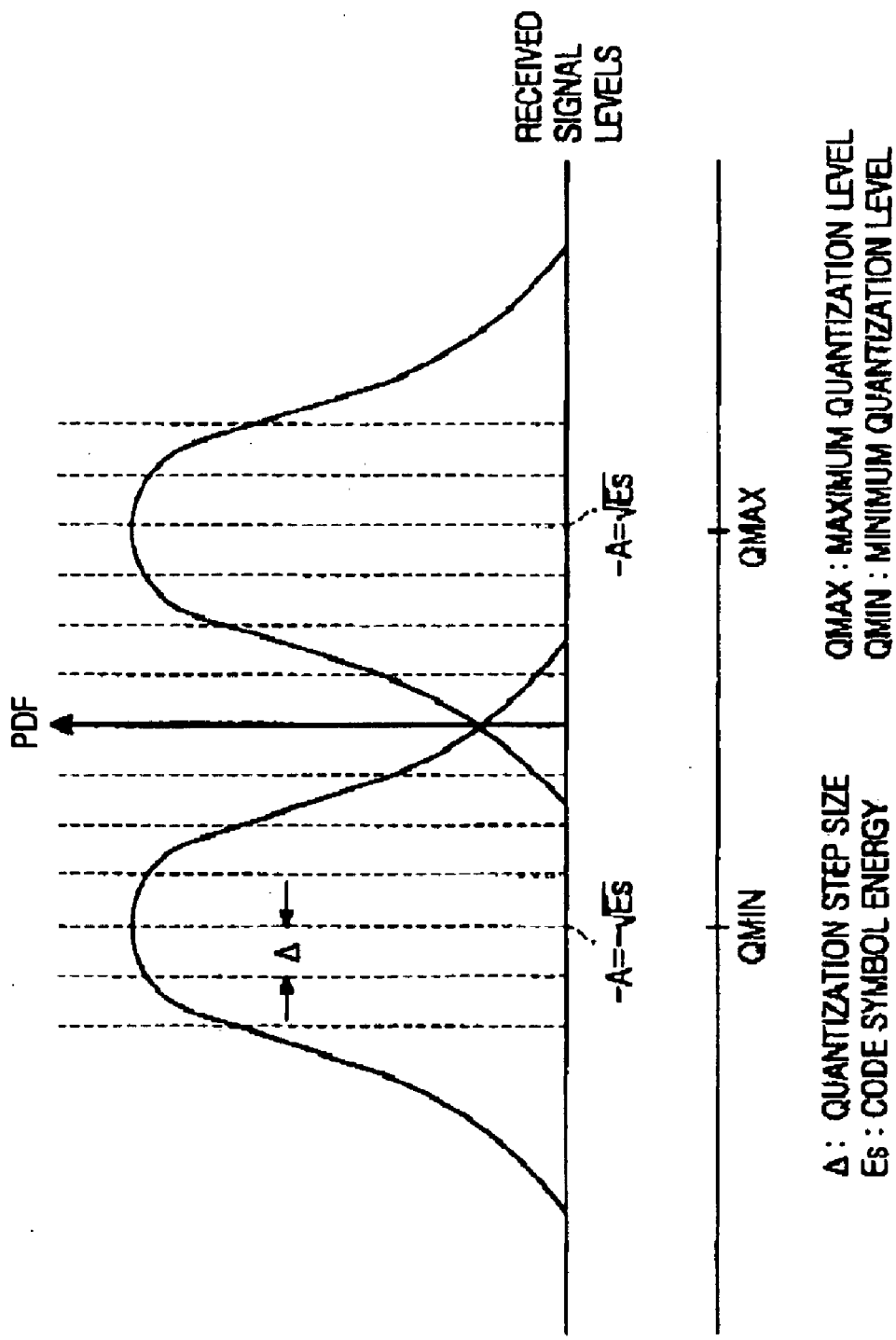
FIG. 2 is a graph illustrating a quantization method for an iterative decoder according to the preferred embodiment of the present invention.

FIG. 2 is a graph illustrating a quantization method for an iterative decoder according to the preferred embodiment of the present invention.

In FIG. 2, the horizontal axis of the graph indicates the amplitude levels of a received signal, and the vertical axis indicates the PDF. It is assumed that the transmission channel for the received signal is an AWGN channel. As shown in FIG. 2, QB is 4 bits which results in 16 QLs. In the preferred embodiment, the quantization range is expanded above the highest level and below the lowest level of the quantization level range from +A to −A, shown in FIG. 1. That is, different levels are assigned to signals above +A and below −A. Thus, expansion of the quantization range above +A and below −A differentiates reliability for the input signal of the iterative decoder.

Figure 1:
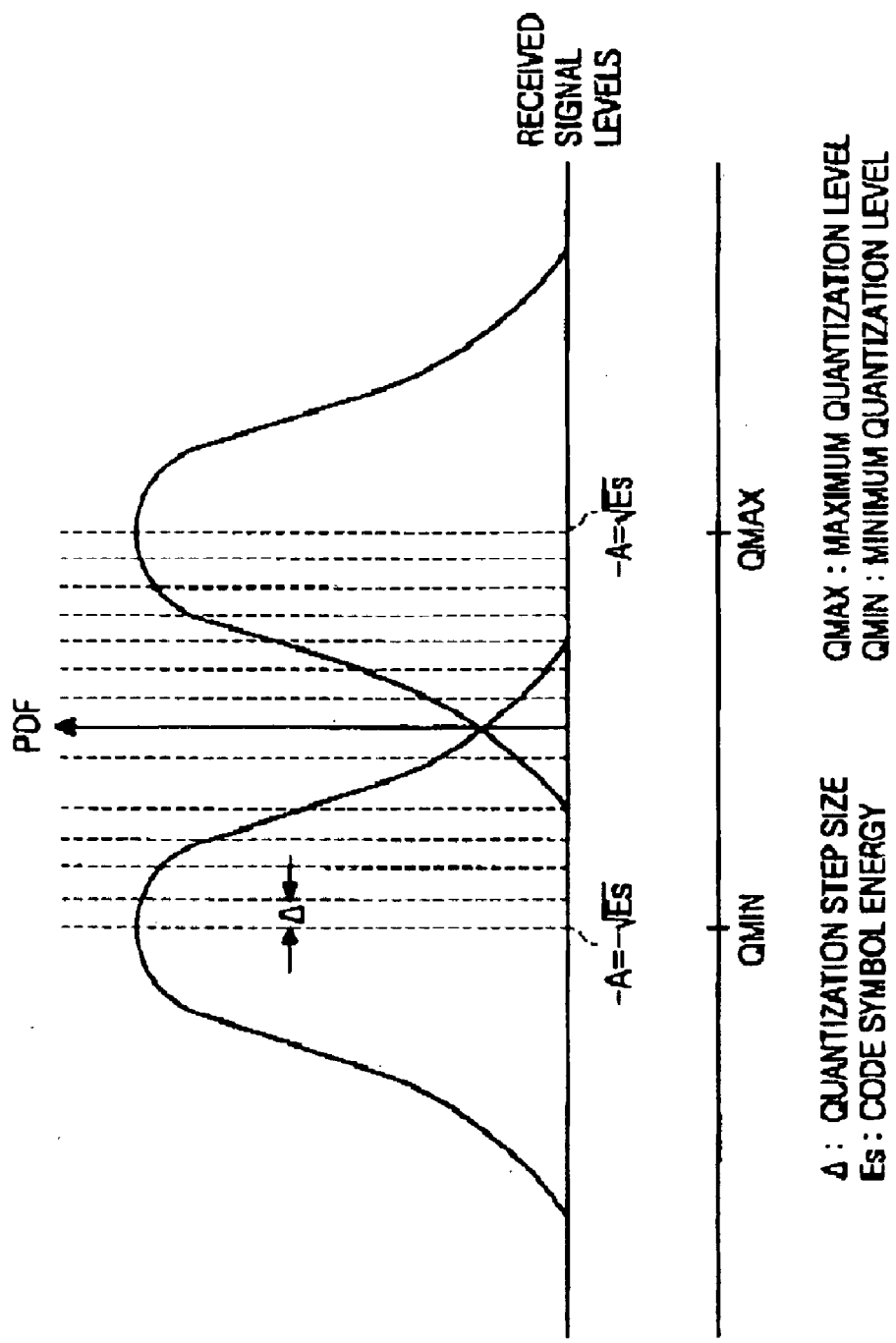
FIG. 1 is a graph illustrating a conventional quantization method for a Viterbi decoder for transmission of a voice signal.

However, if a received signal is represented with 16 levels (QB=4) as in the prior art shown in FIG. 1, the insufficient quantization resolution (QS=1/Δ) resulting from the expanded quantization range may decrease the performance of the iterative decoder. Therefore, the optimal QB should be found and the increase of a dynamic range due to internal metric computation in each component decoder should be considered. Consequently, the number of bits required to process a signal in each component decoder should be greater than the number of quantization bits input signal to the iterative decoder by a predetermined number of bits.

From this perspective, there will be given a detailed description of a method for obtaining an optimal quantization range and QB for a turbo decoder.

Figure 3:
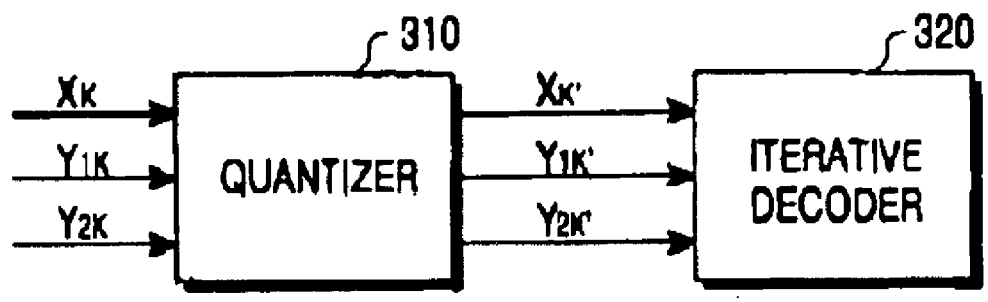
FIG. 3 is a block diagram of a quantizer and an iterative decoder, for illustrating the relation between them according to the preferred embodiment of the present invention.

FIG. 3 is a block diagram of a quantizer for quantizing an input signal and an iterative decoder for receiving the quantized signal according to the preferred embodiment of the present invention.

Referring to FIG. 3, first, second, and third input signals can be analog signals output from a demodulator (not shown) of a receiver (not shown). The first input signal can be a systematic part $X_K$ having the order of original data values. The second and third input signals can be parity parts $Y_{1K}$ and $Y_{2K}$, respectively. That is, the second and third input signals are redundant values added to the original data for error correction in a transmitter. In addition, the second and third input signals can be signals turbo-encoded and interleaved in the transmitter.

For the input of $X_K$, $Y_{1K}$, and $Y_{2K}$, a quantizer 310 outputs quantized signals $X'_K$, $Y'_{1K}$, and $Y'_{2K}$ to an iterative decoder 320 with a quantization range expanded beyond the transmission level range −A to +A according to the preferred embodiment of the present invention.

The iterative decoder 320 can be a turbo decoder. Each component decoder of the iterative decoder 320 can decode an input signal in many ways. Among them, a MAP (Maximum A Posteriori Probability) algorithm or a SOVA (Soft output Viterbi Algorithm) are mainly used. In the case of the SOVA, the dynamic range increased by branch metric computation in the decoder should be considered and predetermined extra bits are needed. Use of the MAP also requires predetermined extra bits since the internal branch metric computation is determined by the code rate. The quantizer 310 of the preferred embodiment of the present invention can operate for both kinds of decoders. The same encoding parameters are used in both above schemes. If the QB of the quantizer 310 is n, the decoder should process an input signal with a precision of n+m (m≧0). The bit number m varies with the code rate of the component decoder.

Figure 4:
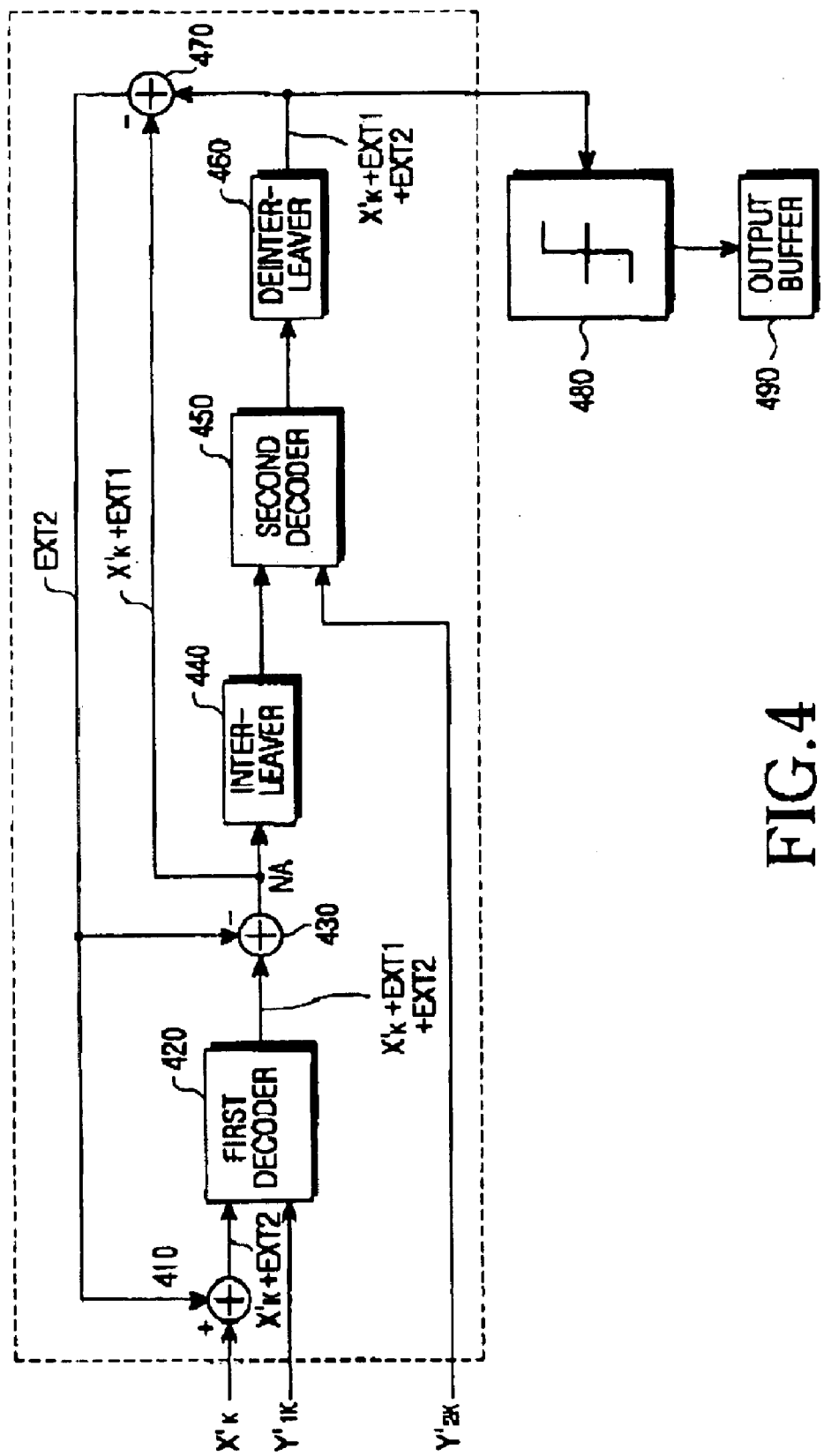
FIG. 4 is a block diagram of an iterative decoder with a code rate 1/3 according to the preferred embodiment of the present invention.

FIG. 4 is a block diagram of a code rate 1/3-turbo decoder according to the preferred embodiment of the present invention.

Referring to FIGS. 3 and 4, first and second decoders 420 and 450 receive soft signal values each having a plurality of bits. The first and second decoders 420 and 450 can operate based on MAP or SOVA. The iterative decoder can be a turbo decoder.

When the first, second, and third input signals are each represented by n bits, they can be mapped to their respective levels among $\{1_0, 1_1, 1_2, \ldots 1_{2^n-1}\}$ by the quantizer 310 of FIG. 3. Then, $$X'_K, Y'_{1K}, Y'_{2K} \in \{1_0, 1_1, 1_2, \ldots 1_{2^n-1}\} \tag{1}$$

A first adder 410 adds the received signal $X'_K$ and an extrinsic information signal EXT2, which does not exist in the initial decoding and is generated from the decoding in the second decoder 450, fed back from a second subtracter 470. The first decoder 420 operates on the output of the first adder 410, $X'_K$+EXT2, and $Y'_{1K}$, and then outputs $X'_K$+EXT1+EXT2. A first subtracter 430 subtracts EXT2 from the output of the first decoder. Therefore, the signal at node NA is $X'_K$+EXT1.

An interleaver 440 permutes a sequence of output from the first subtracter 430 by interleaving, and outputs $X'_K$+EXT1. The second, decoder 450 operates on the output $X'_K$+EXT1 of the interleaver 440 and $Y'_{2K}$, and then outputs $X'_K$+EXT1+EXT2. A deinterleaver 460 reorders the bits of the signal $X'_K$ to their original positions by deinterleaving the output of the second decoder 450. The second subtracter 470 subtracts $X'_K$+EXT1, which is received from the node NA, from the soft signal received from the deinterleaver 460. The output of the second subtracter 470 is used as the extrinsic information signal EXT2 for the first decoder 430.

Error correction performance can be improved as the iterations continue and, at a certain iteration, the output of the decoder becomes error-free. A hard decision device 480 subjects the error-free decoder output to hard decision decoding and feeds the hard-decision signal to an output buffer 490.

In addition, the dynamic ranges of the signals increase due to the metric computation in the first and second decoders 420 and 450. Hence, the signal representation levels should be $2^{n+m}-1$ in each component decoder. n bits is the QB for the input signal in FIG. 3, and m is the number of bits added depending on the dynamic range resulting from metric computation during decoding in each component decoder. Generally, m is determined by the code rate of the component decoders in the iterative decoder.

In accordance with the preferred embodiment of the present invention, the quantization method for an iterative decoder considers the code rate of the component decoders in representing the input signal at predetermined levels. Since the increased dynamic range due to the metric computation should be considered, the QB needed for metric value is n+m bits.

When using a SOVA decoder, the m bit-increase occurs during path metric computation. The path metric at the current point in time is the sum of the path metric accumulated until the decoding at the previous time point (normalized path metric), a branch metric produced by new input at the current time point, and extrinsic information. Therefore, the dynamic range of the new path metric is greater than that of an input signal. The path metric at the current time point k is computed as $$PM(k) = PM(k - l) + BM(k) \qquad (2)$$

$$BM(k) = X(k) \cdot u_i(k) + \sum_i Y_i(k) \cdot c_i(k) + EXT(k)$$

where $c_i(k)$ and $u_i(k)$ are $\{+1, -1\}$.

In Eq. 2, PM(k) is a path metric calculated at k, PM(k−1) is a path metric accumulated until (k−1), BM(k) is a branch metric at k, X(k) is an input systematic signal at k, $Y_i(k)$ is an input ith parity signal, $c_i(k)$ is an ith parity codeword, $u_i(k)$ is an ith systematic codeword, and EXT(k) is an extrinsic information signal.

If the code rate of the iterative decoder is 1/3 in Eq. 2, the branch metric of the first decoder 420 for a new input signal is $$BM(k)=X(k) \cdot u_i(k)+Y_1(k) \cdot c_1(k)+Y_2(k) \cdot c_2(k)+EXT(K) \qquad (3)$$

It is noted from Eq. 3 that BM(k) is the sum of four components. Since $c_i(k)$ is −1 or +1, $$|BM(k)|<4 \cdot 2^{n-1}=2^{n+2-1} \qquad (4)$$

where n is the number of bits assigned to represent the input signal of the iterative decoder, |BM(k)| indicates |X(k)·$u_i$(k)+$Y_i$(k)·$c_i$(k)+$Y_2$(k)·$c_2$(k)+EXT(K)|, and $2^{n-1}$ is the uppermost value of each component. On the assumption that the code rate of the component decoders is 1/3 and signal representation bits (QB=n) are assigned at the input end of the iterative decoder, two (=m) more bits are added to the n bits due to the increase of the dynamic range in the component decoder according to Eq. 4. Being the sum of BM(k) and the PM(k−1), PM(k) has a dynamic range which can be greater than that of BM(k) but is maintained at a constant level due to normalization at each computation. Consequently, when QB=n with a code rate 1/3, use of (n+2) bits for metric computation in the decoder enables the iterative decoder to decode without a decrease of performance. Eq. 4 is an exemplary application for a code rate 1/3 in the iterative decoder and thus can be changed according to the code rate.

Eq. 4 is derived from the idea that the number of bits to be added to BM(k) is determined by detecting the upper-bound value of BM(k). With a code rate 1/4, $5 \cdot 2^{n-1} > |BM(k)|$. Simulation have proven that the iterative decoder can decode without a loss of performance when 2 bits are added for internal metric computation in a component decoder with a code rate of 1/3. The number of components summed up during branch metric computation increases as the code rate of the component decoder decreases. The resulting increase of BM(k) increases m in turn.

Encoding parameters used in the preferred embodiment of the present invention are listed in table 1.

TABLE 1

| | |
|---|---|
| QB | quantization bits |
| QL | quantization levels |
| QMIN | minimum quantization level |
| QMAX | maximum quantization level |
| Δ | quantization step size |
| L | truncation value related with quantization range (the same as the conventional quantization method when L = 1) |
| QS | quantization scaling factor (= 1/Δ) | where QB, L, and QS are parameters which determine the characteristics of a quantizer. In the case of a midthread uniform quantizer, the relation between QL and QB is:

$$QL=2^{QB}-1 \qquad (5)$$

and the relation among QB, QMIN, and QMAX is:

$$QMAX=2^{QB-1}-1=-QMIN \qquad (6)$$

Qs is defined as 1/Δ. If L is determined, then $$QS=1/\Delta \approx (QMAX+1)/(A \cdot L) \text{ or } A \cdot L \approx (QMAX+1)/QS \qquad (7)$$

If L=1, Eq. 7 represent the conventional quantization method shown in FIG. 1. That is, the quantization range is between +A and −A corresponding to the transmission levels of a transmitter. But if L=2, the quantization range is between +2A and −2A and if L=4, it is between +4A and −4A. An optimal parameter set is achieved empirically after the combination of quantization parameters are constructed based on the above equations.

Table 2 illustrates combinations of parameters made to obtain optimal encoding parameters for a SISO turbo decoder according to the preferred embodiment of the present invention.

TABLE 2

| QB | QMAX | QS · A | | | L | | |
|---|---|---|---|---|---|---|---|
| 5 | 15 | 4 | 8 | 16 | 4 | 2 | 1 |
| 6 | 31 | 8 | 16 | 32 | 4 | 2 | 1 |
| 7 | 63 | 16 | 32 | 64 | 4 | 2 | 1 |

If L=4, the quantization range is greater than a transmission level by four times. A later-described test was performed on a quantization range expanded by once, twice, and four times with a given QB. In all parameter combinations, each component decoder has $QL=2^{QB+2}$. Under these conditions, an optimal quantization parameter set is detected.

Table 3 lists simulation results of $E_b/N_o$-QB-QS·A-L combinations with respect to bit error rate (BER) and the frame error rate (FER) referring to the parameter sets shown in table 2. The iterative decoder used is a turbo decoder and its component decoders are log-MAP decoders. See "Implementation and Performance of a Serial MAP Decoder for Use in an Iterative Turbo Decoder", Steven S. Pietrobon, Proc., IEEE Int. Symp. on Information Theory, p.471, 1995, for the log-MAP algorithm. The simulation was performed under the conditions of a F-SCH (Forward Supplemental Channel) of CDMA 2000, RS2 (Rate Set 2) at N=1 mode, and a data rate of 28.kbps (see Radio Transmission Technology (RTT) TIA-TR45.5, 02 Jun. 1998). The test channel used was an AWGN channel and $E_b/N_o$ was 0.5 dB and 1.0 dB.

TABLE 3

| $E_b/N_o$ | QB | QS · A | L | BER | FER |
|---|---|---|---|---|---|
| 0.5 | 5 | 4 | 4 | 2.405209E-02 | 3.079268E-01 |
| 0.5 | 5 | 8 | 2 | 2.039361E-02 | 2.861190E-01 |
| 0.5 | 5 | 16 | 1 | 9.407603E-02 | 9.351852E-01 |
| 0.5 | 6 | 8 | 4 | 1.891814E-02 | 2.596401E-01 |
| 0.5 | 6 | 16 | 2 | 1.804012E-02 | 2.596401E-01 |
| 0.5 | 6 | 32 | 1 | 7.859217E-02 | 8.859649E-01 |
| 0.5 | 7 | 16 | 4 | 1.788339E-02 | 2.451456E-01 |
| 0.5 | 7 | 32 | 2 | 1.784787E-02 | 2.481572E-01 |
| 0.5 | 7 | 64 | 1 | 7.049589E-02 | 8.416667E-01 |
| 1.0 | 5 | 4 | 4 | 1.616280E-03 | 2.884066E-02 |
| 1.0 | 5 | 8 | 2 | 1.445351E-03 | 2.884066E-02 |
| 1.0 | 5 | 16 | 1 | 2.050465E-02 | 3.568905E-01 |
| *1.0 | 6 | 8 | 4 | 9.298841E-04 | 1.847786E-02 |
| 1.0 | 6 | 16 | 2 | 1.126441E-03 | 2.413958E-02 |
| 1.0 | 6 | 32 | 1 | 1.556932E-02 | 3.042169E-01 |
| 1.0 | 7 | 16 | 4 | 9.581362E-04 | 1.826732E-02 |
| 1.0 | 7 | 32 | 2 | 1.047265E-02 | 2.187094E-02 |
| 1.0 | 7 | 64 | 1 | 1.220511E-02 | 2.525000E-01 |

It is obvious from table 3 that with a given QB, the turbo decoder needs a wider quantization range than the conventional quantization method. For example, BER and FER for L=1 at 1.0 dB are 7 to 10 times greater than those for L=2 or 4 at 1.0 dB. That is, if L=1, A=1/QS is the smallest. Hence, the resolution is high but the quantizer range (QR) is not sufficient, thereby incurring performance loss. The turbo decoder needs a wider QR with a given QB, as compared to a Viterbi decoder. When the QB is given, the turbo decoder has a lower quantization resolution but a wider quantizer acting area or range (QR) than the Viterbi decoder. However, the turbo decoder shows a better performance if received signals in the area are all represented by obtaining an optimal L despite the decreased resolution.

When L=2 to 4 with a given QB, the turbo decoder performance is not bad, which implies that a QR is necessary which is at least twice wider than the conventional QR. It is preferable to select optimal quantization parameters when the SNR (Signal to Noise Ratio) is 1.0 dB or above. As found in experiment, optimal QB and QS are 6 and 8, respectively. This implies that optimal parameters allow the QR to be four times greater than A, that is, L to be 4. While good performance can be achieved with QB=7 and QS=16, the performance is little improved as compared to the case that QB=6 and QS=8, thereby causing dissipation of bits to represent an input signal. Finally, it is noted that the performance decrease caused by a narrow QR becomes more serious with a higher SNR.

A quantization threshold should be determined when encoding a signal. The quantization threshold is a limit value to which an input analog signal is mapped. A quantization threshold set is given by $$T=T_{QMIN-1},T_{QMIN},T_{QMIN+1},\ldots,T_{-1},T_0,T_1,\ldots,T_{QMAX-2},T_{QMAX-1},T_{QMAX} \quad (8)$$

and a threshold set for a midthread uniform quantizer is $$T_k = -L \cdot A + \Delta/2 + \Delta \cdot \left(\frac{QL+1}{2} + k\right) \quad (9)$$

where $k=-QMIN, -QMIN+1, -QMIN+2, \ldots, -1, 0, 1, \ldots$, QMAX-1, QMAX, $T_{QMIN-1}=-\infty$, and $T_{QMAX}=+\infty$.

A quantization threshold set for QB=6 and L=4 according to the preferred embodiment of the present invention is listed in table 4. QL=63 and this is expressed in 2's complement binary format. $\Delta=1/QS=A/8$, QMAX=31, and QMIN=−31.

TABLE 4

| k | 2's complement binary format | thresholds $(T_{k-1}, T_k]/A$ |
|---|---|---|
| −31 | 100001 | $(-\infty, -61/16]$ |
| −30 | 100010 | $(-61/16, -59/16]$ |
| −29 | 100011 | $(-59/16, -57/16]$ |
| −28 | 100100 | $(-57/16, -55/16]$ |
| −27 | 100101 | $(-55/16, -53/16]$ |
| . | . | . |
| . | . | . |
| . | . | . |
| −3 | 111101 | $(-7/16, -5/16]$ |
| −2 | 111110 | $(-5/16, -3/16]$ |
| −1 | 111111 | $(-3/16, -1/16]$ |
| 0 | 000000 | $(-1/16, +1/16]$ |
| 1 | 000001 | $(+1/16, +3/16]$ |
| 2 | 000010 | $(+3/16, +5/16]$ |
| 3 | 000011 | $(+5/16, +7/16]$ |
| . | . | . |
| . | . | . |
| . | . | . |
| 27 | 011011 | $(+53/16, +55/16]$ |
| 28 | 011100 | $(+55/16, +57/16]$ |
| 29 | 011101 | $(+57/16, +59/16]$ |
| 30 | 011110 | $(+59/16, +61/16]$ |
| 31 | 011111 | $(+61/16, +\infty]$ |

Figure 5:
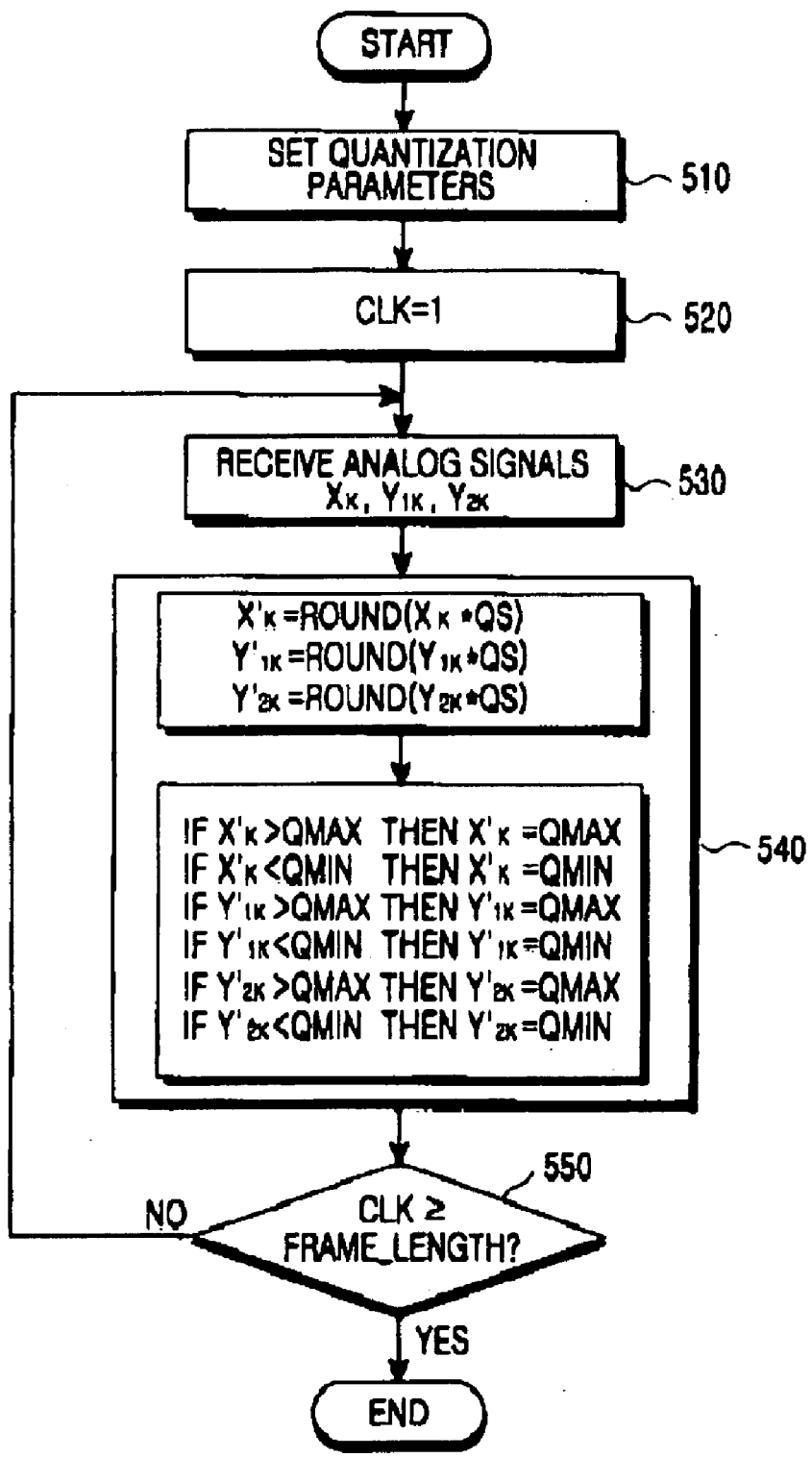
FIG. 5 is a flowchart illustrating a quantization method according to the preferred embodiment of the present invention.

FIG. 5 is a flowchart illustrating a quantization method for an iterative decoder ding to the preferred embodiment of the present invention.

Referring to FIG. 5, the quantizer 310 of FIG. 3 sets encoding parameters in step 510. Here, L should be set in such a way that the quantization range can expand above +A and below −A in order to assign different levels to signals above +A or below −A among the input analog signals $X_K$, $Y_{1K}$, and $Y_{2K}$. For a turbo decoder, an acceptable quantization range is greater than the transmission signal level range −A to +A by $2^1$ to $2^2$ times with a given QB. The QB is set in consideration of an insufficient quantization resolution due to the expansion of the quantization range. A QB of 5 to 7 is acceptable for the input end of the turbo decoder. The number of signal-representing bits in each component decoder should be set in consideration of the dynamic range increase resulting from internal metric computation. If the code rate of an iterative decoder is 1/4 or above, the number of signal representing bits in each component decoder is the sum of the QB at the input end and additional bits. QMAX is $2^{QB-1}$ and QMIN is −QMAX.

The quantizer 310 sets a clock count to 1 in step 520 and receives the analog signals $X_K$, $Y_{1K}$, and $Y_{2K}$ in step 530. In step 540, the quantizer 310 multiplies each of $X_K$, $Y_{1K}$, and $Y_{2K}$ by QS and outputs $X'_K$, $Y'_{1K}$, and $Y'_{2K}$ by a round-off operation. If $X'_K$ is greater than QMAX, it is mapped to QMAX and if it is less than QMIN, it is mapped to QMIN. This also applies to $Y'_{1K}$ and $Y'_{2K}$.

The quantizer 310 determines whether the current clock count is greater than FRAME_LENGTH, which is the frame size of the input signal to be decoded in step 550. If the clock count is lesser than FRAME_LENGTH, which means that the input signal is not at the end of a frame, the quantizer 310 returns to step 530. If the clock count is greater than FRAME_LENGTH, which means that the input signal is at the end of a frame, the quantizer 310 ends quantization for that one frame.

As described above, the quantization method for an iterative decoder according to the preferred embodiment of the present invention expands the quantization range above the highest limit and below the lowest limit of the transmission level range −A to +A, sets a QB in consideration of the resulting insufficient quantization resolution, sets the number of signal-representing bits in each component decoder in consideration of the dynamic range determined by its internal metric computation, and presents criteria on which to obtain optimal quantization parameters when the iterative decoder is implemented in a real situation.

While the invention has been shown and described with reference to a certain preferred embodiments thereof, it will be understood by those skilled in the art that various changes in form and details may be made therein without departing from the spirit and scope of the invention as defined by the appended claims.

What is claimed is:

1. A quantization method for an iterative decoder, comprising the steps of:

equally dividing received signal levels into predetermined intervals, said intervals occupying a range $m \times 2^n$ (n is a positive integer) where a transmission signal level from a transmitter is m; and quantizing the level of a signal received in each period, using the predetermined intervals, wherein the iterative decoder includes at least one component decoder, said at least one component decoder computing a metric using a predetermined number of bits more than a number of bits required to represent the received signal levels.

2. The quantization method of claim 1, wherein the positive integer n is 2.

3. The quantization method of claim 1, wherein the positive integer n is 1.

4. The quantization method of claim 1, wherein the predetermined number of bits are two bits when the iterative decoder has a code rate 1/4 or above.

5. The quantization method of claim 1, wherein each component decoder operates on an input signal using a maximum a posteriori probability (MAP) algorithm or a soft output Viterbi algorithm (SOVA).

6. A quantization method for a turbo decoder in a communication system, comprising the steps of:

equally dividing received signal levels into 8 or 16 quantization scaling factor intervals using 5 to 7 quantization bits within a range $m \times 2^n$ (n is a positive integer) where a transmission signal level from a transmitter is m; and quantizing the level of a signal received in each period, using the intervals, wherein the turbo decoder includes at least one component decoder, said at least one component decoder computing a metric using a predetermined number of bits more than a number of bits required to represent the received signal levels.

7. The quantization method of claim 6, wherein the positive integer n is 2.

8. The quantization method of claim 6, wherein the number of the quantization bits is 6.

9. The quantization method of claim 8, wherein the quantization scaling factor interval is 8.

10. The quantization method of claim 6, wherein the predetermined number of bits are two bits when the turbo decoder has a code rate 1/4 or above.

11. The quantization method of claim 6, wherein each component decoder decodes an input signal using a maximum a posteriori probability (MAP) algorithm or a soft output Viterbi algorithm (SOVA).

* * * * *